United States Patent [19]

Todd

[11] Patent Number: 4,644,185

[45] Date of Patent: Feb. 17, 1987

[54] SELF CLOCKING CMOS LATCH

[75] Inventor: Ronald C. Todd, Riverton, Utah

[73] Assignee: National Semiconductor Corporation, Santa Clara, Calif.

[21] Appl. No.: 730,130

[22] Filed: May 3, 1985

[51] Int. Cl.$^4$ .................. H03K 3/26; H03K 19/096; G11C 7/00

[52] U.S. Cl. .................................. 307/279; 307/481; 307/269; 307/530; 365/190

[58] Field of Search ............... 307/279, 288, 530, 358, 307/269, 480, 481, 494, 497; 365/190; 330/253

[56] References Cited

U.S. PATENT DOCUMENTS

| | | | |
|---|---|---|---|
| 4,247,791 | 1/1981 | Rovell | 365/190 |
| 4,506,171 | 3/1985 | Evan et al. | 307/530 |
| 4,567,389 | 1/1986 | Tran | 307/530 |

*Primary Examiner*—Stanley D. Miller
*Assistant Examiner*—Trong Quang Phan
*Attorney, Agent, or Firm*—Gail W. Woodward

[57] ABSTRACT

A CMOS latch is coupled to a differential driver that is operated from the input data. Driver conduction is determined by the conduction in a strobe transistor responding to the signal of a strobe line. The strobe line is normally operated at a level that turns the strobe transistor off. The strobe line is coupled to the output of a four input comparator which senses the DATA IN, $\overline{\text{DATA IN}}$, DATA OUT and $\overline{\text{DATA OUT}}$. So long as the DATA IN and DATA OUT are in agreement the strobe line will remain at the level that holds the strobe transistor off and the latch will remain in its original state. However, if there is a disagreement the comparator will produce an output that turns the strobe transistor on and the device will then reset the latch. Thus, the circuit will only change its latch state when the input logic changes.

6 Claims, 5 Drawing Figures

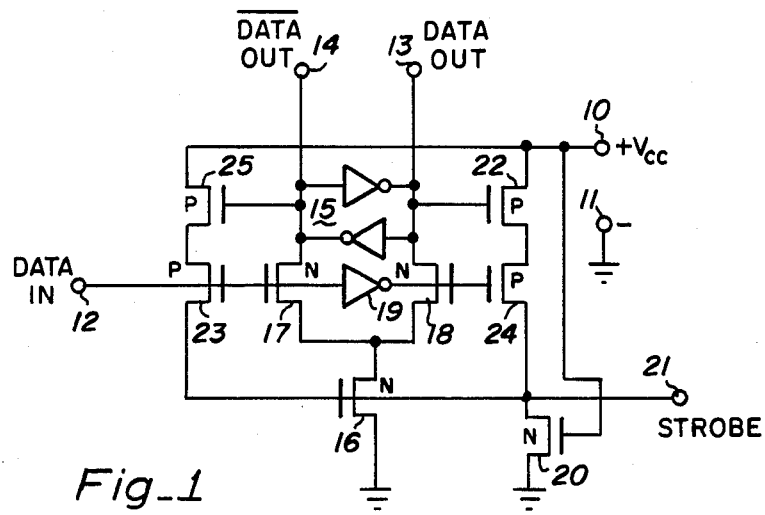
Fig_1
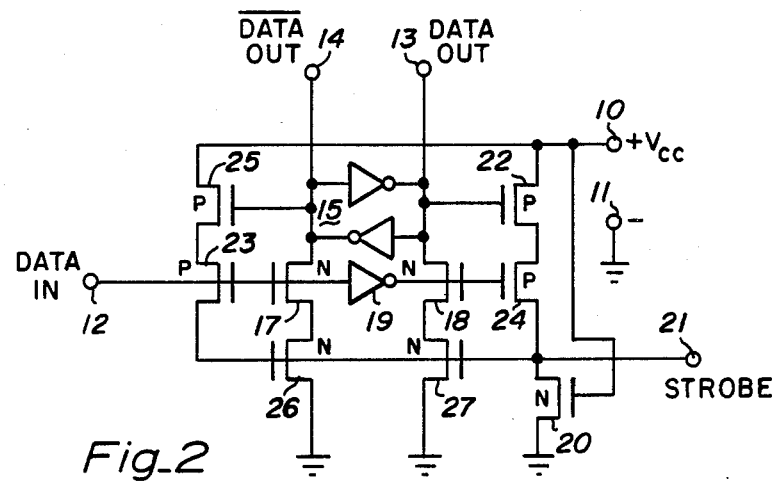
Fig_2
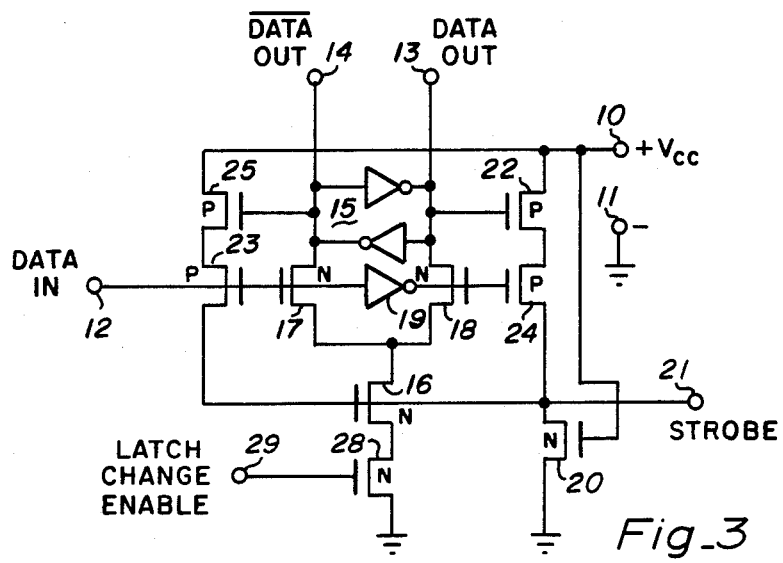
Fig_3

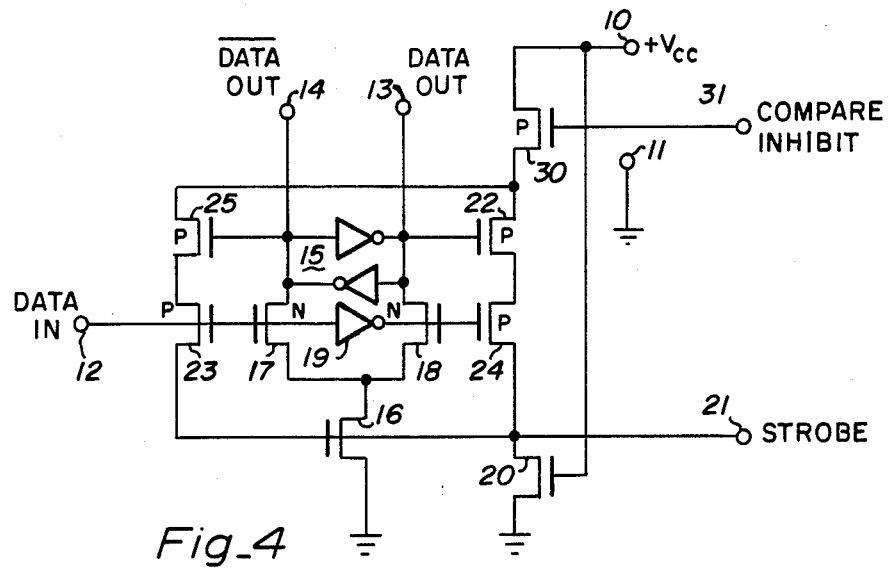
Fig_4
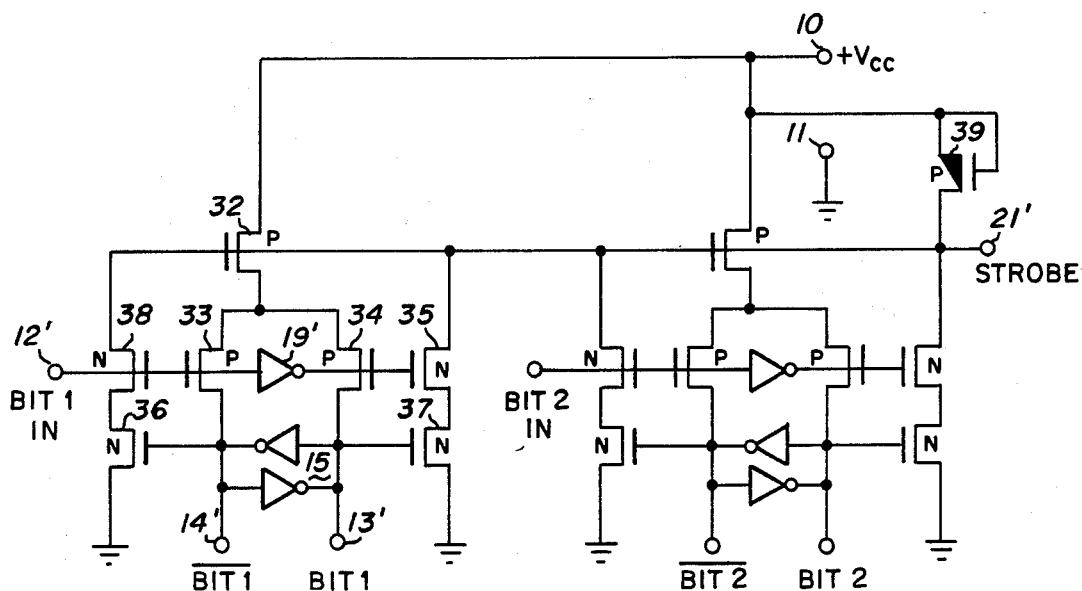
Fig_5

SELF CLOCKING CMOS LATCH

BACKGROUND OF THE INVENTION

The invention relates to static latches employed in digital logic systems. Wherever a latch is to be employed in a static memory system the circuit of the invention can be employed. The circuit employs fewer devices than in the prior art circuits and operates at higher speeds so that logic delays are reduced.

SUMMARY OF THE INVENTION

It is an object of the invention to create a static latch that senses its logic state, compares it with the input data and then changes state only when its input disagrees with its state.

It is a further object of the invention to create a static latch using a minimum number of parts.

It is a still further object of the invention to create a static latch having minimum logic delays.

These and other objects are achieved in a CMOS circuit as follows. The heart of the circuit is a latch formed by cross coupling a pair of inverters. This latch has a pair of outputs for develoing the DATA and $\overline{DATA}$ output signals. These output terminals are driven from a differentially operated driver that is energized by way of a STROBE line. Energization of the driver acts to set the latch in a state determined by the driver. A four input comparator senses the DATA and $\overline{DATA}$ input and output signals and acts to drive the STROBE line. So long as the DATA and $\overline{DATA}$ inputs and outputs agree there is no STROBE signal developed and the latch will remain in its existing state. When there is a disagreement between the DATA and $\overline{DATA}$ inputs and outputs, a STROBE signal will be generated. This will turn on the latch driver which will then reset the latch to a state in which the disagreement vanishes. Thus, the latch will be reset only when its input data changes. The circuit configuration can operate very rapidly with a minimum of parts.

BRIEF DESCRIPTION OF THE DRAWING

FIG. 1 is a schematic diagram of a CMOS static latch circuit according to the invention.

FIG. 2 is a schematic diagram of an alternative CMOS static latch circuit.

FIG. 3 is a schematic diagram of the circuit of FIG. 1 including a latch change enable circuit.

FIG. 4 is a schematic diagram of the circuit of FIG. 1 including a compare inhibit circuit.

FIG. 5 is a schematic diagram of a CMOS static plural latch circuit according to the invention and showing a circuit configuration complementary to that of FIGS. 1-4.

DESCRIPTION OF THE INVENTION

FIG. 1 is a schematic diagram of the basic circuit of the invention. A $V_{CC}$ power supply is connected + to terminal 10 and − to ground terminal 11. Terminal 12 is the DATA input terminal and terminal 13 is the DATA output terminal while terminal 14 is the $\overline{DATA}$ output terminal.

The heart of the circuit is a latch 15 created by coupling a pair of inverters back to back as shown. N-channel transistors 17 and 18 are coupled to be differentially driven from DATA input terminal 12. Their conduction is set by the current flowing in N-channel transistor 16. Inverter 19 drives the gate of transistor 18 differentially from the gate of transistor 17. It can be seen that transistors 17 and 18 will conduct differentially as a function of the DATA logic state to the extent determined by N-channel transistor 16. N-channel transistor 20 is normally conducting because its gate is returned to $+V_{CC}$ and it acts to pull the strobe line, terminal 21, low. This will render transistor 16 normally non conductive. This in turn prevents conduction in transistor 17 and 18. Under these conditions latch 15 will retain its original state indefinitely.

The circuit will compare its logic state to that of the DATA as follows. P-channel transistors 22-25 form a differentially operating four input comparator which has its output connected to drive the strobe line. Assume that DATA out at terminal 13 is a logic 1 or high. The gate of P-channel transistor 22 will be at $+V_{CC}$ thereby turning it off. If the DATA out agrees with the DATA in (at a logic 1) P channel transistor 23 will be off. Thus, neither side of the comparator will conduct and the strobe line will remain low.

Again, assuming that terminal 13 is high for a logic one and that the DATA is in disagreement therewith or at logic zero. Transistor 23 will be turned on. Since the logic data at terminal 14 would be at zero, transistor 25 will also be turned on. Thus, transistors 23 and 25 conducting in series would pull the strobe line up thereby turning transistor 16 on. Since it was stated that the DATA in was at logic zero inverter 19 will apply a logic one to transistor 18 thereby turning it on. This will force terminal 13 low and reset latch 15 to this state. Once the latch assumes the state where the DATA out is again in agreement with the DATA in one of transistors 22 or 25 will be turned off and neither side of the comparator can conduct.

If the above noted data disagreement is of the opposite sense, transistors 22 and 24 will be turned on thereby turning transistors 16 and 17 on. This will set latch 15 to provide a logic one at terminal 13 and a zero at terminal 14.

From the above, it can be seen that the comparator senses the latch logic state and compares it with the DATA in. If there is no disagreement there is no strobe and the latch remains in its original state. If a disagreement exists a strobe is generated and the latch is switched to agree with the DATA. As will be shown in detail hereinafter STROBE terminal 22 can be coupled to other latch circuits. Thus, a plurality of latches can be simultaneously reset to adjust to their DATA inputs.

FIG. 2 shows an alternative embodiment of the circuit of the invention. Here transistor 16 of FIG. 1 has been replaced by two N channel transistors 26 and 27. Since both of these devices are driven in parallel by the strobe line, when the strobe is high both will be turned on and one of transistors 17 or 18 will conduct. Otherwise, the FIG. 2 circuit operates as did FIG. 1.

The schematic diagram of FIG. 3 shows another alternative embodiment of the invention. Here the strobe driven transistor 16 of FIG. 1 has an N channel transistor 28 coupled in series. Its gate is driven from LATCH CHANGE ENABLE terminal 29. When terminal 29 is low the latch will not change state regardless of the nature of the DATA IN and DATA OUT relationship. When terminal 29 is high the circuit operates normally as did the FIG. 1 circuit.

The schematic diagram of FIG. 4 is still another alternative embodiment of the invention. In this embodiment a P channel transistor 30 is coupled in series between the sources of transistors 22 and 15 and the +V$_{CC}$ terminal 10. Its gate is returned to terminal 31 which is the COMPARE INHIBIT terminal. When terminal 31 is high the comparator is rendered inoperative and no strobe signal can be developed. When terminal 31 is low the circuit operates normally as did the circuit of FIG. 1.

The schematic diagram of FIG. 5 is still another alternative embodiment of the invention. It shows that the strobe line can be used to operate more than one latch and driver-comparator circuit. In addition, the roles of the P-channel and N-channel transistors have also been inverted to show a complementary circuit form. While two latches are shown, any number could be involved. Normally, a latch circuit will be employed for each digit in the digital word being employed in the logic system. The operation of one latch will now be detailed.

Input terminal 12' is shown being driven by BIT 1 logic. Output terminals 13' and 14' represent BIT 1 OUT and $\overline{\text{BIT 1 OUT}}$ respectively. Latch 15 is as was described for FIGS. 1-4. P-channel transistors 33 and 34 are operated differentially to conduct the current in P-channel transistor 32. Input terminal 12' is directly coupled to the gate of transistor 33 and inverter 19' drives the gate of transistor 34 differentially. N-channel transistors 35-38 form a four input comparator having an output coupled to drive the strobe line (terminal 21'). A depletion load transistor 38 is normally conducting so as to pull the strobe line up close to +V$_{CC}$. This normally turns transistor 32 off. When the latch produces a logic one output at terminal 13' and the BIT 1 IN is a logic zero, transistors 35 and 37 will both be turned on so as to pull the strobe line down to turn transistor 32 on. This will force transistor 33 to conduct which produces a logic one at terminal 14' and a logic zero at terminal 13' which means that the latch is reset.

The BIT 2 latch operates in the same way. The two latches are interconnected by the strobe line (terminal 21') so that when any latch is reset, due to an input-output disagreement in that latch, all of the latches are strobbed so as to make a comparison and to reset if there is any disagreement.

The invention has been described with reference to CMOS embodiments. When a person skilled in the art reads the foregoing description, alternatives and equivalents within the spirit and intent of the invention, will be apparent. For example, while CMOS embodiments are disclosed, and the invention is intended primarily for CMOS, other digital circuit forms, such as PMOS, NMOS, and bipolar, could benefit from the concepts. Accordingly, it is intended that the scope of the invention be limited only by the following claims.

I claim:

1. A self clocking latch circuit comprising:
   a latch having DATA and $\overline{\text{DATA}}$ output terminals;
   differentially conducting driver means coupled to said DATA and $\overline{\text{DATA}}$ output terminals for forcing said latch to one of two states;
   differentially conducting sense means coupled to respond to the state of said latch and to a DATA input signal to form a comparator that compares said latch state and said DATA input and produces an output strobe signal when said latch state and said DATA input are in disagreement; and
   means responsive to said output strobe signal for rendering said differentially conducting driver means operative to force said latch to the state represented by said DATA input.

2. The circuit of claim 1 wherein said latch is formed by cross coupling a pair of inverters across said DATA and $\overline{\text{DATA}}$ output terminals.

3. The circuit of claim 1 wherein said differentially conducting driver means comprise a pair of transistors having outputs coupled to said DATA and $\overline{\text{DATA}}$ output terminals of said latch and transistor means coupled in common with said pair of transistors and responsive to said output strobe signal for conduction of said transistor means.

4. The circuit of claim 1 wherein said differentially conducting sense means comprise a four input comparator coupled to said DATA and $\overline{\text{DATA}}$ output terminals of said latch and to said DATA input and the complement thereof.

5. The circuit of claim 3 further including latch change enable means coupled to said transistor means coupled in common with said pair of transistors.

6. The circuit of claim 4 further including compare inhibit means coupled between a voltage supply and said four input comparator to control the flow of current in said four input comparator.

* * * * *